United States Patent
Kido et al.

(10) Patent No.: US 12,415,948 B2
(45) Date of Patent: *Sep. 16, 2025

(54) SEMICONDUCTOR NANOPARTICLE COMPLEX DISPERSION LIQUID, SEMICONDUCTOR NANOPARTICLE COMPLEX, SEMICONDUCTOR NANOPARTICLE COMPLEX COMPOSITION AND SEMICONDUCTOR NANOPARTICLE COMPLEX CURED MEMBRANE

(71) Applicant: SHOEI CHEMICAL INC., Tokyo (JP)

(72) Inventors: Makoto Kido, Tosu (JP); Hirokazu Sasaki, Tosu (JP); Takafumi Moriyama, Tosu (JP); Yuko Mitsuka, Tosu (JP)

(73) Assignee: SHOEI CHEMICAL INC., Tokyo (JP)

( * ) Notice: Subject to any disclaimer, the term of this patent is extended or adjusted under 35 U.S.C. 154(b) by 953 days.

This patent is subject to a terminal disclaimer.

(21) Appl. No.: 17/595,923

(22) PCT Filed: May 29, 2020

(86) PCT No.: PCT/JP2020/021464
§ 371 (c)(1),
(2) Date: Nov. 29, 2021

(87) PCT Pub. No.: WO2020/241872
PCT Pub. Date: Dec. 3, 2020

(65) Prior Publication Data
US 2022/0315834 A1    Oct. 6, 2022

(30) Foreign Application Priority Data

May 31, 2019  (JP) .................. 2019-103239
May 31, 2019  (JP) .................. 2019-103240

(51) Int. Cl.
| | |
|---|---|
| C09K 11/02 | (2006.01) |
| C09D 5/22 | (2006.01) |
| C09D 11/037 | (2014.01) |
| C09D 11/322 | (2014.01) |
| C09D 11/50 | (2014.01) |
| C09K 11/08 | (2006.01) |
| C09K 11/88 | (2006.01) |
| B82Y 20/00 | (2011.01) |
| B82Y 40/00 | (2011.01) |
| C08K 9/04 | (2006.01) |

(52) U.S. Cl.
CPC ........... *C09K 11/025* (2013.01); *C09D 5/22* (2013.01); *C09D 11/037* (2013.01); *C09D 11/322* (2013.01); *C09D 11/50* (2013.01); *C09K 11/0883* (2013.01); *C09K 11/883* (2013.01); *B82Y 20/00* (2013.01); *B82Y 40/00* (2013.01); *C08K 9/04* (2013.01); *C08K 2201/011* (2013.01)

(58) Field of Classification Search
CPC . C09K 11/025; C09K 11/0883; C09K 11/883; C08K 9/04; B82Y 20/00; B82Y 40/00; C09D 5/22; C09D 11/037; C09D 11/322; C09D 11/50
See application file for complete search history.

(56) References Cited

U.S. PATENT DOCUMENTS

| | | | | |
|---|---|---|---|---|
| 2007/0269904 A1* | 11/2007 | Uyeda | ..................... | B82Y 5/00 |
| | | | | 436/525 |
| 2018/0148638 A1* | 5/2018 | Ahn | ..................... | C09K 11/883 |
| 2018/0187074 A1* | 7/2018 | Sasaki | ..................... | C09K 11/06 |
| 2019/0011782 A1* | 1/2019 | Pickett | ................. | C09K 11/025 |

FOREIGN PATENT DOCUMENTS

| | | | |
|---|---|---|---|
| JP | 2013136498 A | 7/2013 | |
| JP | 2015086284 A | 5/2015 | |
| JP | 2019073705 A | 5/2019 | |
| WO | 2017038487 A1 | 3/2017 | |
| WO | WO-2017200824 A1 * | 11/2017 | ............... C08K 3/30 |
| WO | 2018224459 A1 | 12/2018 | |
| WO | 2018226654 A1 | 12/2018 | |

(Continued)

OTHER PUBLICATIONS

Dubois, F. et al., "A Versatile Strategy for Quantum Dot Ligand Exchange," Journal of the American Chemical Society, vol. 129, No. 3. Dec. 23, 2006, 2 pages.

Jin, T., "Semiconductor quantum dots: their synthesis and application to bioscience," Production and Technology, vol. 63, No. 2, 2011, 13 pages (submitted with machine translation).

Pong, B. et al., "Modified Ligand-Exchange for Efficient Solubilization of CdSe/ZnS Quantum Dots in Water: A Procedure Guided by Computational Studies," Langmuir, vol. 24, Apr. 16, 2008, 7 pages.

(Continued)

*Primary Examiner* — Jane L Stanley
(74) *Attorney, Agent, or Firm* — Alleman Hall & Tuttle LLP

(57) ABSTRACT

Provided is a semiconductor nanoparticle complex dispersion liquid in which semiconductor nanoparticles are dispersed in a polar dispersion medium at a high mass fraction, and in which high fluorescence quantum efficiency (QY) is maintained. A semiconductor nanoparticle complex dispersion liquid according to an embodiment includes a semiconductor nanoparticle complex dispersed in an organic dispersion medium, wherein: the semiconductor nanoparticle complex is composed of two or more ligands including an aliphatic thiol ligand and a polar ligand, and a semiconductor nanoparticle with the ligands coordinated to the surface thereof; the ligands are composed of an organic group and a coordinating group; the organic group of the polar ligand includes a hydrophilic functional group; and an SP value of the organic dispersion medium is 8.5 or more.

19 Claims, 2 Drawing Sheets

(56) References Cited

FOREIGN PATENT DOCUMENTS

WO  2018226925 A1  12/2018
WO  2019008374 A1  1/2019

OTHER PUBLICATIONS

Rahman, S. et al., "Thiolate-Capped CdSe/ZnS Core-Shell Quantum Dots for the Sensitive Detection of Glucose," Sensors, vol. 17, No. 7, Jul. 1, 2017, 12 pages.
Wenger, W. et al., "Functionalization of Cadmium Selenide Quantum Dots with Poly(ethylene glycol): Ligand Exchange, Surface Coverage, and Dispersion Stability," Langmuir, vol. 33, No. 33, Aug. 2, 2017, 7 pages.

\* cited by examiner

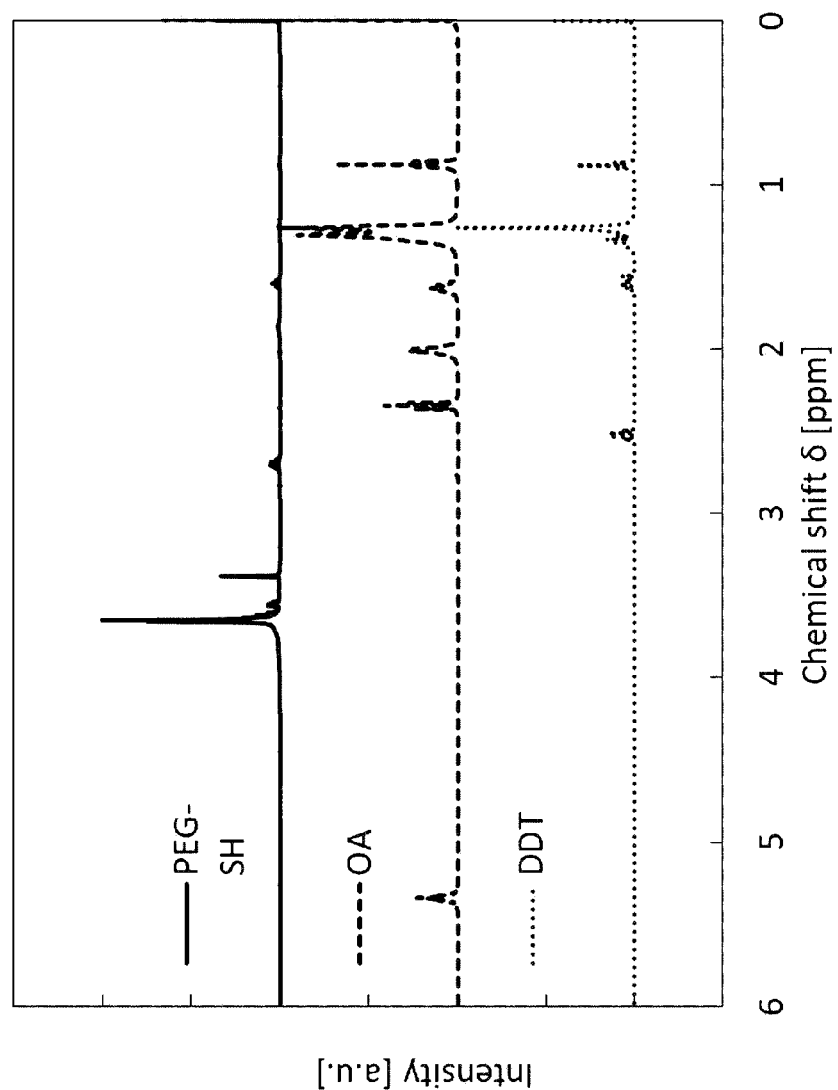

સેMICONDUCTOR NANOPARTICLE COMPLEX DISPERSION LIQUID, SEMICONDUCTOR NANOPARTICLE COMPLEX, SEMICONDUCTOR NANOPARTICLE COMPLEX COMPOSITION AND SEMICONDUCTOR NANOPARTICLE COMPLEX CURED MEMBRANE

TECHNICAL FIELD

The present invention relates to a semiconductor nanoparticle complex dispersion liquid, a semiconductor nanoparticle complex, a semiconductor nanoparticle complex composition, and a semiconductor nanoparticle complex cured membrane.

This application claims priority based on Japanese Patent Application No. 2019-103239 filed on May 31, 2019 and Japanese Patent Application No. 2019-103240 filed on the same day, and the contents described in the Japanese patent applications are incorporated herein in the entirety.

BACKGROUND ART

Semiconductor nanoparticles that are so small that a quantum confinement effect is exhibited have a bandgap that depends on the particle diameter. Excitons formed in semiconductor nanoparticles by means of photoexcitation, charge injection, and the like, emit photons with energy corresponding to the band gap by recombination, hence, light emission at a desired wavelength can be obtained by appropriately selecting the composition of the semiconductor nanoparticles and particle diameter thereof.

At the early stage of the research, semiconductor nanoparticles were mainly studied for elements including Cd and Pb, but since Cd and Pb are substances subject to regulation by the Restriction of the Use of Certain Hazardous Substances, in recent years, research on non-Pb-based and non-Cd-based semiconductor nanoparticles has been carried out.

Attempts have been made to use semiconductor nanoparticles in a variety of applications such as display applications, biomarking applications, and solar cell applications. In particular, in display applications, the use of semiconductor nanoparticles formed into a membrane as a wavelength conversion layer has begun.

CITATION LIST

Patent Literature

[PTL 1] Japanese Patent Application Publication No. 2013-136498.

Non Patent Literature

[NPL 1] Takashi Kami, "Semiconductor quantum dots: their synthesis and application to bioscience", Production and Technology, Vol. 63, No. 2, p. 58-63, 2011.
[NPL 2] Fabien Dubois et al., "A Versatile Strategy for Quantum Dot Ligand Exchange" J. AM. CHEM. SOC Vol. 129, No. 3, p. 482-483, 2007
[NPL 3] Boon-Kin Pong et al., "Modified Ligand-Exchange for Efficient Solubilization of CdSe/ZnS Quantum Dots in Water: A Procedure Guided by Computational Studies" Langmuir Vol. 24, No. 10, p. 5270-5276, 2008.
[NPL 4] Samsulida Abd. Rahman et al, "Thiolate-Capped CdSe/ZnS Core-Shell Quantum Dots for the Sensitive Detection of Glucose" Sensors Vol. 17, No. 7, p. 1537, 2017.
[NPL 5] Whitney Nowak Wenger et al, "Functionalization of Cadmium Selenide Quantum Dots with Poly(ethylene glycol): Ligand Exchange, Surface Coverage, and Dispersion Stability" Langmuir, Vol. 33, No. 33, pp. 8239-8245, 2017.

SUMMARY OF INVENTION

Technical Problem

Semiconductor nanoparticles and semiconductor nanoparticle complexes can generally be dispersed in a dispersion medium, and prepared as a dispersion liquid, and used in various fields. In particular, for practicality, it is desirable to disperse semiconductor nanoparticles and semiconductor nanoparticle complexes in a dispersion medium having an SP value of 8.5 or more.

Semiconductor nanoparticles and semiconductor nanoparticle complexes synthesized in a non-polar dispersion medium are highly hydrophobic and therefore can be easily dispersed in a non-polar dispersion medium, but dispersing in a polar dispersion medium having an SP value of 8.5 or more is difficult.

It is presumed that semiconductor nanoparticles and semiconductor nanoparticle complexes synthesized in a non-polar dispersion medium have a small dipole-dipole force and hydrogen bonding force. Therefore, even among polar dispersion media having an SP value of 8.5 or more, semiconductor nanoparticles can be dispersed in toluene and chloroform, which have small dipole-dipole force and hydrogen bonding force, as in the case of semiconductor nanoparticles synthesized in an organic solvent. However, these polar dispersion media are highly toxic and therefore impractical.

A ligand exchange method and an encapsulation method are known as methods for making semiconductor nanoparticles dispersible in a polar dispersion medium having an SP value of 8.5 or more. With the ligand exchange method, a ligand contained in a semiconductor nanoparticle complex obtained by binding a ligand to the surface of a semiconductor nanoparticle is exchanged with a ligand having a hydrophilic group. The semiconductor nanoparticle complex thus obtained can be dispersed in a polar dispersion medium. However, a problem associated with the semiconductor nanoparticle complexes disclosed in NPL 1 to 5 and PTL 1 is that although the semiconductor nanoparticles can be dispersed in a polar dispersion medium, the luminous efficiency is lowered. In the encapsulation method, a semiconductor nanoparticle complex obtained by binding a ligand to the surface of a semiconductor nanoparticle is further coated with an amphipathic polymer. However, where the encapsulation method is performed, the amount of the dispersant with respect to the semiconductor nanoparticles increases, which makes it difficult to increase the mass fraction of the semiconductor nanoparticles.

Therefore, it is an object of the present invention to solve the above problems and provide a semiconductor nanoparticle complex dispersion liquid in which semiconductor nanoparticles are dispersed in a polar dispersion medium at a high mass fraction while maintaining high fluorescence quantum yield (QY).

Solution to Problem

A semiconductor nanoparticle complex dispersion liquid according to the present invention is
- a dispersion liquid in which a semiconductor nanoparticle complex is dispersed in an organic dispersion medium, wherein
- the semiconductor nanoparticle complex is composed of two or more ligands including an aliphatic thiol ligand and a polar ligand, and a semiconductor nanoparticle with the ligands coordinated to the surface thereof; and
- the ligands are composed of an organic group and a coordinating group;
- the organic group of the polar ligand includes a hydrophilic functional group; and
- an SP value of the organic dispersion medium is 8.5 or more.

In the present application, the range indicated by preposition "to" includes the numbers indicated at both ends thereof.

Advantageous Effects of Invention

According to the present invention, it is possible to provide a semiconductor nanoparticle complex dispersion liquid in which semiconductor nanoparticles are dispersed in a polar dispersion medium at a high mass fraction while maintaining high fluorescence quantum yield (QY).

BRIEF DESCRIPTION OF DRAWINGS

FIG. 2 is a graph showing the results of analysis of a ligand used in the Example by 1H-NMR.

DESCRIPTION OF EMBODIMENTS (Semiconductor Nanoparticle Complex)

Figure 1:
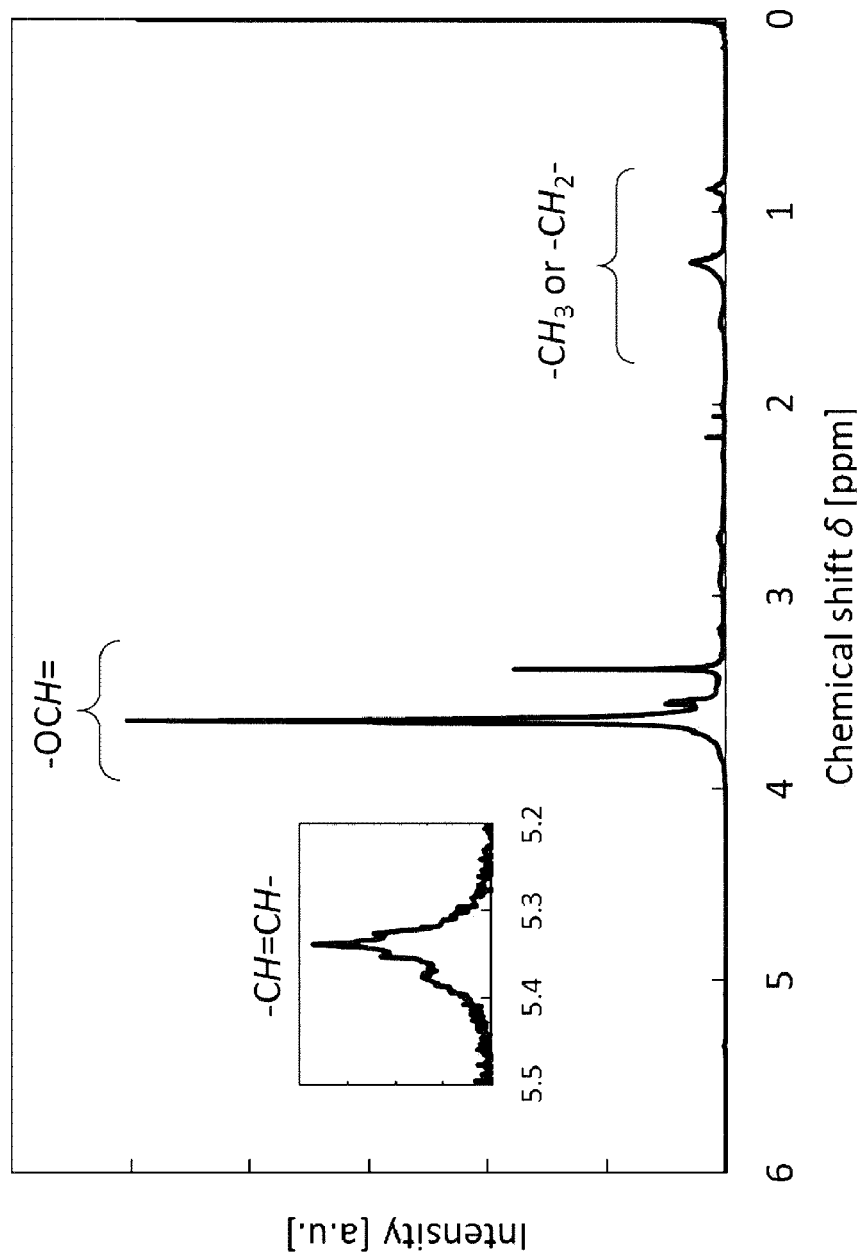
FIG. 1 is a graph showing the results of analysis of a semiconductor nanoparticle complex in an Example by 1H-NMR.

In the semiconductor nanoparticle complex according to the present invention, two or more kinds of ligands are coordinated to the surface of the semiconductor nanoparticle. The semiconductor nanoparticle complex according to the present invention has high light emission characteristics and can be dispersed in a dispersion medium or a cured membrane at a high mass fraction.

In the present invention, the semiconductor nanoparticle complex is a semiconductor having light emission characteristics. The semiconductor nanoparticle complex of the present invention is a particle that absorbs light of 340 nm to 480 nm and emits light having an emission peak wavelength of 400 nm to 750 nm.

The full width at half maximum (FWHM) of the emission spectrum of the semiconductor nanoparticle complex is preferably 40 nm or less, and more preferably 35 nm or less. Where the full width at half maximum of the emission spectrum is within the above range, color mixing can be reduced when the semiconductor nanoparticle complex is applied to a display or the like.

The fluorescence quantum yield (QY) of the semiconductor nanoparticle complex is preferably 80% or more, and more preferably 85% or more. When the fluorescence quantum yield of the semiconductor nanoparticle complex is 80% or more, color conversion can be performed more efficiently. In the present invention, the fluorescence quantum yield of the semiconductor nanoparticle complex can be measured using a quantum yield measurement system.

—Semiconductor Nanoparticle— semiconductor nanoparticle constituting the semiconductor nanoparticle complex is not particularly limited as long as the above-mentioned fluorescence quantum yield and light emission characteristics such as full width at half maximum are satisfied, and may be a particle made of one type of semiconductor or a particle composed of two or more different semiconductors. In the case of particles composed of two or more different types of semiconductors, a core-shell structure may be composed of these semiconductors. For example, the particle may be of a core-shell type having a core including a Group III element and a Group V element and a shell including a Group II element and a Group VI element covering at least a part of the core. Here, the shell may have a plurality of shells having different compositions, or may have one or more gradient-type shells in which the ratio of elements constituting the shell changes in the shell.

Specific examples of Group III elements include In, Al and Ga.

Specific examples of Group V elements include P, N and As.

The composition for forming the core is not particularly limited, but InP is preferable from the viewpoint of light emission characteristics.

The Group II element is not particularly limited, and examples thereof include Zn and Mg.

Examples of Group VI elements include S, Se, Te and O.

The composition for forming the shell is not particularly limited, but from the viewpoint of the quantum confinement effect, ZnS, ZnSe, ZnSeS, ZnTeS, ZnTeSe, and the like are preferable. In particular, when a Zn element is present on the surface of the semiconductor nanoparticle, the effect of the present invention can be exerted to a greater extent.

When the nanoparticle has a plurality of shells, it is sufficient that at least one shell having the above-mentioned composition be included. Further, in the case of a gradient-type shell in which the ratio of elements constituting the shell changes in the shell, the shell does not necessarily have to have the composition according to the composition notation.

Here, in the present invention, whether the shell covers at least a part of the core and the element distribution inside the shell can be confirmed by composition analysis by, for example, energy dispersive X-ray spectroscopy (TEM-EDX) using a transmission electron microscope.

In the present invention, the average particle diameter of semiconductor nanoparticles can be measured by calculating the particle diameter of 10 or more particles by an area equivalent diameter (Heywood diameter) in a particle image observed using a transmission electron microscope (TEM). From the viewpoint of light emission characteristics, a narrow particle size distribution is preferable, and a coefficient of variation of the particle diameter is preferably 15% or less. Here, the coefficient of variation is defined as "coefficient of variation=(standard deviation of particle diameter)/(average particle diameter)". The coefficient of variation of 15% or less indicates that semiconductor nanoparticles having a narrower particle diameter distribution are obtained.

Disclosed hereinbelow is an example of a method for producing semiconductor nanoparticles.

A core of a semiconductor nanoparticle can be formed by heating a precursor mixture obtained by mixing a Group III precursor, a Group V precursor, and, if necessary, an additive in a solvent.

A coordinating solvent or a non-coordinating solvent is used as the solvent. Examples of solvents include 1-octadecene, hexadecane, squalene, oleylamine, trioctylphosphine, trioctylphosphine oxide, and the like.

Examples of Group III precursors include, but are not limited to, acetates, carboxylates, halides, and the like containing the Group III elements.

Examples of Group V precursors include, but are not limited to, organic compounds and gases containing the Group V elements. Where the precursor is a gas, a core can be formed by reacting while injecting a gas into a precursor mixture including components other than the gas.

The semiconductor nanoparticles may include one or two or more elements other than Group III and Group V as long as the effects of the present invention are not impaired. In this case, the precursor(s) of the element(s) may be added at the time of core formation.

Examples of the additive include, but are not limited to, carboxylic acids, amines, thiols, phosphines, phosphine oxides, phosphinic acids, and phosphonic acids as dispersants. The dispersant can also serve as a solvent.

After forming the core of the semiconductor nanoparticles, the emission characteristics of the semiconductor nanoparticles can be improved by adding a halide as needed.

In one embodiment, an In precursor and, if necessary, a metal precursor solution obtained by adding a dispersant to a solvent are mixed under vacuum and heated once at 100° C. to 300° C. for 6 h to 24 h, followed by the addition of a P precursor, heating at 200° C. to 400° C. for 3 min to 60 min, and then cooling. Further, by adding a halogen precursor and heat-treating at 25° C. to 300° C., preferably 100° C. to 300° C., and more preferably 150° C. to 280° C., a core particle dispersion liquid including core particles can be obtained.

As a result of adding a shell-forming precursor to the synthesized core particle dispersion liquid, semiconductor nanoparticles have a core-shell structure, and the fluorescence quantum yield (QY) and stability can be improved.

The elements that constitute the shell are thought to have a structure such as an alloy, heterostructure, or amorphous structure on the surface of the core particles, but it is also conceivable that some of them have moved to the inside of the core particles due to diffusion.

The added shell-forming element is mainly present near the surface of the core particle and has a role of protecting the semiconductor nanoparticle from external factors. In the core-shell structure of the semiconductor nanoparticles, it is preferable that the shell covers at least a part of the core, and more preferably the entire surface of the core particle is uniformly covered.

In one embodiment, a Zn precursor and a Se precursor are added to the core particle dispersion liquid described above, then heating is performed at 150° C. to 300° C., preferably 180° C. to 250° C., and then the Zn precursor and the S precursor are added and heating is performed at 200° C. to 400° C., preferably 250° C. to 350° C. As a result, core-shell type semiconductor nanoparticles can be obtained.

Here, although not particularly limited, examples of suitable Zn precursors include carboxylates such as zinc acetate, zinc propionate and zinc myristate, halides such as zinc chloride and zinc bromide, and organic salts such as diethyl zinc.

Examples of suitable Se precursors include phosphine selenides such as tributylphosphine selenide, trioctylphosphine selenide and tris(trimethylsilyl)phosphine selenide, selenols such as benzeneselenol and selenocysteine, and selenium/octadecene solutions.

Examples of suitable S precursors include phosphine sulfides such as tributylphosphine sulfide, trioctylphosphine sulfide and tris(trimethylsilyl)phosphine sulfide, thiols such as octanethiol, dodecanethiol and octadecanethiol, and sulfur/octadecene solutions.

The precursors of the shell may be mixed in advance and added once or in multiple times, or each may be added separately once or in multiple times. When the shell precursors are added in multiple times, heating by changing the temperature may be performed after each shell precursor is added.

In the present invention, a method for producing semiconductor nanoparticles is not particularly limited, and in addition to the methods shown above, conventional methods such as a hot injection method, a uniform solvent method, a reverse micelle method, and a CVD method can be used, or any other method may be adopted.

—Ligand—

In the present invention, in a semiconductor nanoparticle complex, ligands are coordinated to the surface of the semiconductor nanoparticle. The coordination mentioned herein means that the ligand chemically affects the surface of the semiconductor nanoparticle. The ligand may be bonded to the surface of the semiconductor nanoparticle by coordination bonding or in any other bonding mode (for example, by covalent bond, ionic bond, hydrogen bond, and the like), or when the ligand is present on at least a portion of the surface of the semiconductor nanoparticle, the ligand does not necessarily have to form a bond.

In the present invention, the ligand coordinated to a semiconductor nanoparticle consists of an organic group and a coordinating group. Two or more ligands, including an aliphatic thiol ligand and a polar ligand, are coordinated to the surface of the semiconductor nanoparticle. In the aliphatic thiol ligand, the organic group is an aliphatic hydrocarbon group and the coordinating group is a mercapto group. In addition, the polar ligand includes a hydrophilic functional group as an organic group.

The organic group of the aliphatic thiol ligand is preferably an aliphatic hydrocarbon group having 6 to 14 carbon atoms. The structure of the organic group of the aliphatic thiol ligand may be linear, branched, or a non-aromatic ring, and high fluorescence quantum yield can be obtained when the organic group has 6 to 14 carbon atoms. The aliphatic thiol ligand is preferably one or more selected from the group consisting of hexanethiol, octanethiol, decanethiol, and dodecanethiol. By adopting these ligands as aliphatic thiol ligands, higher fluorescence quantum yield can be obtained.

Since the coordinating group of the aliphatic thiol ligand is a mercapto group, the aliphatic thiol ligand can be firmly coordinated to the surface of the semiconductor nanoparticle.

The polar ligand has a hydrophilic functional group as an organic group. For example, at least one of a hydroxyl group, a carboxyl group, a carbonyl group, an amino group, an ether bond, an ester bond and a siloxane bond can be selected as the hydrophilic functional group. Having a hydrophilic functional group as the organic group of the polar ligand enables dispersion in a polar dispersion medium. In particular, when the organic group of the polar ligand contains an ether bond, high fluorescence quantum yield can be obtained and dispersion is possible in a wide range of polar dispersion media. Where dispersion is possible in a wide range of polar dispersion media, in applications in which the semiconductor nanoparticle complex in which a ligand is coordinated to the surface of a semiconductor nanoparticle is included in a resin, the reaction between the ligand and the resin hardly occurs, so that the selection is possible from a wider range of resins.

The coordinating group of the polar ligand is preferably a mercapto group or a carboxyl group, and particularly preferably a mercapto group, because of the strength of coordination to the semiconductor nanoparticle.

The molecular weight of the polar ligand is preferably 50 or more and 600 or less, and more preferably 50 or more and 450 or less. By using a ligand having a molecular weight of 600 or less, it is possible to suppress an increase in the size and volume of the semiconductor nanoparticle complex, and when the semiconductor nanoparticle complex is used in a dispersion liquid, a composition, a cured membrane, or the like, the mass fraction of the semiconductor nanoparticle complex with respect to these can be easily increased. Meanwhile, when the molecular weight is 50 or more, the effect of steric hindrance is sufficiently exhibited, and the occurrence of aggregation and the like can be suppressed.

By setting the molecular weight of the polar ligand in the semiconductor nanoparticle complex to the above range, the semiconductor nanoparticle complex can be dispersed in a below-described organic dispersion medium at a high mass fraction.

The mass ratio of the aliphatic thiol ligand to the polar ligand (aliphatic thiol ligand/polar ligand) may be 0.05 to 1.00. Where the mass ratio is in this range, high fluorescence quantum yield can be obtained. Where the mass ratio (aliphatic thiol ligand/polar ligand) of the aliphatic thiol ligand to the polar ligand exceeds 1.00, it may be difficult to disperse the complex in a polar dispersion medium having an SP value of 8.5 or more. The mass ratio (aliphatic thiol ligand/polar ligand) is more preferably 0.10 to 1.00, and even more preferably 0.20 to 0.80.

When the ligand includes a ligand other than the aliphatic thiol ligand and the polar ligand, the total mass fraction of the aliphatic thiol ligand and the polar ligand is preferably 0.7 or more with respect to all the ligands. By setting the mass fraction to 0.7 or more, the semiconductor nanoparticle complex can be easily dispersed in a polar dispersion medium, and lowering of the fluorescence quantum yield can be avoided. The total mass fraction of the aliphatic thiol ligand and the polar ligand in the entire ligand is more preferably 0.8 or more.

The mass ratio of the aliphatic thiol ligand and the polar ligand coordinated to the surface of the semiconductor nanoparticle can be quantified using 1H-NMR. The obtained semiconductor nanoparticle complex is dispersed in a deuterated solvent, electromagnetic waves are applied in a magnetic field to cause 1H nuclear magnetic resonance, and a free induction decay signal obtained at this time is Fourier-analyzed to obtain a 1H-NMR spectrum. Since the 1H-NMR spectrum gives a characteristic signal at a position corresponding to the structure of the ligand species, each ligand species is identified from the position and the integrated intensity ratio of these signals, and the ratio is calculated. Examples of the deuterated solvent include $CDCl_3$, acetone-d6, N-hexane-D14, and the like.

(Method for Producing Semiconductor Nanoparticle Complex)

The following is an example of a method for producing a semiconductor nanoparticle complex.

A method for coordinating a ligand to a semiconductor nanoparticle is not limited, and a ligand exchange method using the coordinating force of the ligand can be used. Specifically, semiconductor nanoparticles in which the organic compound used in the process of producing the semiconductor nanoparticles described above is coordinated to the surface of the semiconductor nanoparticles are brought into contact with the target ligand in a liquid phase, thereby making it possible to obtain a semiconductor nanoparticle complex in which the target ligand is coordinated to the surface of the semiconductor nanoparticle. In this case, a liquid-phase reaction using a solvent as described hereinbelow is usually carried out, but when the ligand to be used is a liquid under the reaction conditions, a reaction mode is possible in which the ligand itself is used as a solvent and no other solvent is added.

Further, where the below-described purification step and redispersion step are performed before the ligand is coordinated, the desired ligand can be easily coordinated.

When a non-coordinating solvent is used in the synthesis of the semiconductor nanoparticles, the formation of defects on the surface of the semiconductor nanoparticles can be minimized when the desired ligand is coordinated, and the fluorescence quantum yield can be prevented from reducing.

In one embodiment, the desired semiconductor nanoparticle complex can be obtained by purifying and redispersing the semiconductor nanoparticles-containing dispersion liquid after the production of semiconductor nanoparticles, then adding a solvent including an aliphatic thiol ligand, further adding a solvent including a polar ligand, and stirring at 50° C. to 200° C. for 1 min to 120 min under a nitrogen atmosphere. The aliphatic thiol ligand and the polar ligand may be added at the same time.

The semiconductor nanoparticles and semiconductor nanoparticle complex can be purified in the following manner. In one embodiment, the semiconductor nanoparticle complex can be precipitated from the dispersion liquid by adding a polarity-changing solvent such as acetone. The precipitated semiconductor nanoparticle complex can be collected by filtration or centrifugation, while supernatant containing unreacted starting materials and other impurities may be discarded or reused. The precipitated semiconductor nanoparticle complex can then be washed with additional dispersion medium and dispersed again. This purification process can be repeated, for example, 2 to 4 times, or until the desired purity is achieved.

In the present invention, the method for purifying the semiconductor nanoparticle complex is not particularly limited, and in addition to the methods shown above, for example, flocculation, liquid-liquid extraction, distillation, electrodeposition, size-selection chromatography and/or ultrafiltration, and the like may be used. Any method can be used alone or in combination.

(Semiconductor Nanoparticle Complex Dispersion Liquid)

The semiconductor nanoparticle complex contained in the semiconductor nanoparticle complex dispersion liquid of the present invention can adopt the above-mentioned configuration of the semiconductor nanoparticle complex of the present invention. In the present invention, the state in which the semiconductor nanoparticle complex is dispersed in the dispersion medium represents a state in which the semiconductor nanoparticle complex does not precipitate or a state in which the semiconductor nanoparticle complex does not remain creating visible turbidity (cloudiness) when the semiconductor nanoparticle complex and the dispersion medium are mixed. A liquid obtained by dispersing the semiconductor nanoparticle complex in a dispersion medium is referred to as a semiconductor nanoparticle complex dispersion liquid.

The semiconductor nanoparticle complex of the present invention can be dispersed in an organic dispersion medium to form a semiconductor nanoparticle complex dispersion liquid. The semiconductor nanoparticle complex of the present invention is dispersed in an organic dispersion medium having an SP value of 8.5 or more, an organic dispersion medium having an SP value of 9.0 or more, or an organic dispersion medium having an SP value of 10.0 or more to form a semiconductor nanoparticle complex dispersion liquid.

The SP value here is the Hildebrand solubility parameter, which is a value calculated from the Hansen solubility parameter. The Hansen solubility parameter is described in the handbook, for example, "Hansen Solubility Parameters: A User's Handbook", 2nd Edition, C. M. Hanson (2007), and can be determined using a Practice (HSPiP) program (2nd edition) provided by Hanson and Abbot et al.

By setting the mass ratio of the aliphatic thiol ligand to the polar ligand as described above, it is possible to disperse the semiconductor nanoparticle complex in any one or more organic dispersion media selected from the group consisting of hexane, acetone, propylene glycol monomethyl ether acetate (PGMEA), propylene glycol monomethyl ether (PGME), isopropyl alcohol (IPA), isobornyl acrylate (IBOA), ethanol, and methanol. In particular, polar organic dispersion media such as alcohols, ketones, esters, glycol ethers and glycol ether esters can be selected as the organic dispersion medium. By dispersing in these organic dispersion media, the resulting dispersion liquid can be used while maintaining the dispersibility of the semiconductor nanoparticle complex when applied to dispersion in a cured membrane or resin described hereinbelow. In particular, in the field of photoresists, PGMEA and PGME are generally used as diluting solvents, and where the semiconductor nanoparticle complex can be dispersed in PGMEA and PGME, the semiconductor nanoparticle complex can be widely used in the photoresist field.

When the semiconductor nanoparticle complex has the above-mentioned structure, the semiconductor nanoparticle complex can be dispersed in an organic dispersion medium at a high mass fraction, and as a result, the mass fraction of the semiconductor nanoparticles in the semiconductor nanoparticle complex dispersion liquid can be made 20% by mass or more, further 25% by mass or more, and even further 35% by mass or more.

Further, in the present invention, a monomer can be selected as a dispersion medium for the semiconductor nanoparticle complex dispersion liquid. The monomer is not particularly limited, but a (meth)acrylic monomer that enables selection of a wide range of applications for the semiconductor nanoparticles is preferable. The (meth) acrylic monomer can be selected according to the application of the semiconductor nanoparticle complex dispersion liquid from the group consisting of methyl (meth)acrylate, ethyl (meth)acrylate, propyl (meth)acrylate, butyl (meth) acrylate, isobutyl (meth)acrylate, isoamyl (meth)acrylate, octyl (meth)acrylate, 2-ethylhexyl (meth)acrylate, dodecyl (meth)acrylate, isodecyl (meth)acrylate, lauryl (meth)acrylate, stearyl (meth)acrylate, cyclohexyl (meth)acrylate, isobornyl (meth)acrylate, 3,5,5-trimethylcyclohexanol (meth)acrylate, dicyclopentanyl (meth)acrylate, dicyclopentenyl (meth)acrylate, methoxyethyl (meth)acrylate, ethyl carbitol (meth)acrylate, methoxytriethylene glycol acrylate, 2-ethylhexyl diglycol acrylate, methoxypolyethylene glycol acrylate, methoxydipropylene glycol acrylate, phenoxyethyl (meth)acrylate, 2-phenoxydiethylene glycol (meth)acrylate, 2-phenoxypolyethylene glycol (meth)acrylate (n 2), tetrahydrofurfuryl (meth)acrylate, 2-hydroxyethyl acrylate, 2-hydroxypropyl (meth)acrylate, 4-hydroxybutyl (meth)acrylate, 2-hydroxybutyl (meth)acrylate, dicyclopentanyloxy ethyl (meth)acrylate, isobornyloxyl ethyl (meth)acrylate, adamantyl (meth)acrylate, dimethyladamantyl (meth)acrylate, dicyclopentenyloxyethyl (meth)acrylate, benzyl (meth)acrylate, ω-carboxy-polycaprolactone (n 2) monoacrylate, 2-hydroxy-3-phenoxypropyl acrylate, 2-hydroxy-3-phenoxyethyl (meth)acrylate, (2-methyl-2-ethyl-1,3-dioxolan-4-yl) methyl (meth)acrylate, (3-ethyloxetane-3-yl)methyl (meth) acrylate, o-phenylphenolethoxy (meth)acrylate, dimethylamino (meth)acrylate, diethylamino (meth)acrylate, 2-(meth)acryloyloxyethylphthalic acid, 2-(meth)acryloyloxyethylhexahydrophthalic acid, glycidyl (meth)acrylate, 2-(meth)acryloyloxyethylphosphoric acid, acryloylmorpholine, dimethylacrylamide, dimethylaminopropylacrylamide, iropropylacrylamide, diethylacrylamide, hydroxyethylacrylamide, and N-acryloyloxyethyl hexahydrophthalimide. These can be used alone or in combination of two or more. In particular, the acrylic monomer is preferably one or a mixture of two or more selected from lauryl (meth)acrylate and 1,6-hexadioldi (meth)acrylate depending on the application of the semiconductor nanoparticle complex dispersion liquid.

A prepolymer can be selected as the dispersion medium of the semiconductor nanoparticle complex dispersion liquid. The prepolymer is not particularly limited, and examples thereof include an acrylic resin prepolymer, a silicone resin prepolymer, and an epoxy resin prepolymer.

The semiconductor nanoparticle complex dispersion liquid of the present invention preferably has a fluorescence quantum yield (QY) of 80% or more, and more preferably 85% or more. When the fluorescence quantum yield of the semiconductor nanoparticle complex dispersion liquid is 80% or more, color conversion can be performed more efficiently. The fluorescence quantum yield of the semiconductor nanoparticle complex dispersion liquid can be measured using a quantum yield measurement system.

(Semiconductor Nanoparticle Complex Composition)

In the present invention, a monomer or a prepolymer can be selected as the dispersion medium of the semiconductor nanoparticle complex dispersion liquid to form a semiconductor nanoparticle complex composition.

The monomer or prepolymer is not particularly limited, and examples thereof include radically polymerizable compounds including an ethylenically unsaturated bond, siloxane compounds, epoxy compounds, isocyanate compounds, and phenol derivatives.

Further, a crosslinking agent may be added to the semiconductor nanoparticle complex composition.

Depending on the type of monomer in the semiconductor nanoparticle complex composition, the crosslinking agent may be selected from a polyfunctional (meth)acrylate, a polyfunctional silane compound, a polyfunctional amine, a polyfunctional carboxylic acid, a polyfunctional thiol, a polyfunctional alcohol, and a polyfunctional isocyanate.

Further, the semiconductor nanoparticle complex composition can further include various organic solvents that do not affect curing, such as aliphatic hydrocarbons such as pentane, hexane, cyclohexane, isohexane, heptane, octane, and petroleum ether, alcohols, ketones, esters, glycol ethers and glycol ether esters, aromatic hydrocarbons such as benzene, toluene, xylene and mineral spirits, and alkyl halides such as dichloromethane and chloroform. The above-mentioned organic solvent can be used not only for diluting the semiconductor nanoparticle complex composition but also as an organic dispersion medium. That is, it is also possible to disperse the semiconductor nanoparticle complex of the present invention in the above-mentioned organic solvent to obtain a semiconductor nanoparticle complex dispersion liquid.

Further, the semiconductor nanoparticle complex composition may include an appropriate initiator, scattering agent, catalyst, binder, surfactant, adhesion promoter, antioxidant, UV absorber, anti-aggregation agent, a dispersant, and the like depending on the type of monomer in the semiconductor nanoparticle complex composition.

Further, in order to improve the optical characteristics of the semiconductor nanoparticle complex composition or the semiconductor nanoparticle complex cured membrane described hereinbelow, the semiconductor nanoparticle complex composition may include a scattering agent. The scattering agent is a metal oxide such as titanium oxide or zinc oxide, and the particle diameter thereof is preferably 100 nm to 500 nm. From the viewpoint of the effect of scattering, the particle diameter of the scattering agent is more preferably 200 nm to 400 nm. By including the scattering agent, the absorbance is improved by a factor of about twice. The amount of the scattering agent is preferably 2% by mass to 30% by mass, and more preferably 5% by mass to 20% by mass from the viewpoint of maintaining the patterning property of the composition.

With the configuration of the semiconductor nanoparticle complex of the present invention, the mass fraction of the semiconductor nanoparticles in the semiconductor nanoparticle complex composition can be set to 30% by mass or more. By setting the mass fraction of the semiconductor nanoparticles in the semiconductor nanoparticle complex composition to 30% by mass to 95% by mass, the semiconductor nanoparticle complex and the semiconductor nanoparticles can be dispersed in the below-described cured membrane at a high mass fraction.

When the semiconductor nanoparticle complex composition of the present invention is formed into a membrane having a thickness of 10 μm, the absorbance of the membrane with respect to light having a wavelength of 450 nm from the normal direction is preferably 1.0 or more, more preferably 1.3 or more. And even more preferably 1.5 or more. As a result, the light from the backlight can be efficiently absorbed, so that the thickness of the cured membrane described hereinbelow can be reduced, and the device using the membrane can be miniaturized.

(Diluted Composition)

The diluted composition is obtained by diluting the above-described semiconductor nanoparticle complex composition of the present invention with an organic solvent.

The organic solvent for diluting the semiconductor nanoparticle complex composition is not particularly limited, and examples thereof include aliphatic hydrocarbons such as pentane, hexane, cyclohexane, isohexane, heptane, octane, and petroleum ether, alcohols, ketones, esters, glycol ethers, glycol ether esters, aromatic hydrocarbons such as benzene, toluene, xylene and mineral spirit, and alkyl halides such as dichloromethane and chloroform. Among these, glycol ethers and glycol ether esters are preferable from the viewpoint of solubility in a wide range of resins and membrane uniformity at the time of coating.

(Semiconductor Nanoparticle Complex Cured Membrane)

In the present invention, the semiconductor nanoparticle complex cured membrane is a membrane that includes a semiconductor nanoparticle complex and has been cured. The semiconductor nanoparticle complex cured membrane can be obtained by curing the above-mentioned semiconductor nanoparticle complex composition or diluted composition into a membrane.

The semiconductor nanoparticle complex cured membrane includes semiconductor nanoparticles, ligands coordinated to the surface of the semiconductor nanoparticles, and a polymer matrix.

The polymer matrix is not particularly limited, and examples thereof include (meth)acrylic resins, silicone resins, epoxy resins, silicone resins, maleic acid resins, butyral resins, polyester resins, melamine resins, phenol resins, and polyurethane resins. A semiconductor nanoparticle complex cured membrane may be obtained by curing the semiconductor nanoparticle complex composition described above. The semiconductor nanoparticle complex cured membrane may further include a crosslinking agent.

A method for curing the membrane is not particularly limited, and the membrane can be cured by a curing method suitable for the composition constituting the membrane, such as heat treatment and ultraviolet treatment.

The semiconductor nanoparticle and the ligand coordinated to the surface of the semiconductor nanoparticle, which are included in the semiconductor nanoparticle complex cured membrane, preferably constitute the above-described semiconductor nanoparticle complex. By configuring the semiconductor nanoparticle complex contained in the semiconductor nanoparticle complex cured membrane of the present invention as described above, the semiconductor nanoparticle complex can be dispersed in the cured membrane at a higher mass fraction. The mass fraction of the semiconductor nanoparticles in the semiconductor nanoparticle complex cured membrane is preferably 30% by mass or more, and more preferably 40% by mass or more. However, where the mass fraction is 70% by mass or more, the amount of the composition constituting the membrane is reduced, and it becomes difficult to cure and form the membrane.

Since the semiconductor nanoparticle complex cured membrane of the present invention includes the semiconductor nanoparticle complex at a high mass fraction, the absorbance of the semiconductor nanoparticle complex cured membrane can be increased. When the semiconductor nanoparticle complex cured membrane has a thickness of 10 μm, the absorbance with respect to light having a wavelength of 450 nm from the normal direction of the semiconductor nanoparticle complex cured membrane is preferably 1.0 or more, more preferably 1.3 or more, and even more preferably 1.5 or more.

Further, since the semiconductor nanoparticle complex cured membrane of the present invention includes a semiconductor nanoparticle complex having high light emission characteristics, it is possible to provide a semiconductor nanoparticle complex cured membrane having high light emission characteristics. The fluorescence quantum yield of the semiconductor nanoparticle complex cured membrane is preferably 70% or more, and more preferably 80% or more.

The thickness of the semiconductor nanoparticle complex cured membrane is preferably 50 μm or less, more preferably 20 μm or less, and even more preferably 10 μm or less in order to miniaturize the device in which the semiconductor nanoparticle complex cured membrane is to be used.

(Semiconductor Nanoparticle Complex Patterning Membrane and Display Element)

A semiconductor nanoparticle complex patterning membrane can be obtained by forming the above-described semiconductor nanoparticle complex composition or diluted composition into a membrane-shaped pattern. The method for patterning the semiconductor nanoparticle complex composition and the diluted composition is not particularly limited, and examples thereof include spin coating, bar coating, inkjet, screen printing, and photolithography.

The display element uses the above-mentioned semiconductor nanoparticle complex patterning membrane. For example, by using a semiconductor nanoparticle complex patterning membrane as a wavelength conversion layer, it is possible to provide a display element having excellent fluorescence quantum yield.

The semiconductor nanoparticle complex dispersion liquid of the present invention has the following configuration.

(1) A semiconductor nanoparticle complex dispersion liquid in which a semiconductor nanoparticle complex is dispersed in an organic dispersion medium, wherein
the semiconductor nanoparticle complex is composed of two or more ligands including an aliphatic thiol ligand and a polar ligand, and a semiconductor nanoparticle with the ligands coordinated to the surface thereof; and
the ligands are composed of an organic group and a coordinating group;
the organic group of the polar ligand includes a hydrophilic functional group; and an SP value of the organic dispersion medium is 8.5 or more.

(2) The semiconductor nanoparticle complex dispersion liquid as described in (1) hereinabove, wherein
the SP value of the organic dispersion medium is 9.0 or more.

(3) The semiconductor nanoparticle complex dispersion liquid as described in (1) or (2) hereinabove, wherein
the organic dispersion medium is one dispersion medium or two or more mixed dispersion media selected from the group consisting of alcohols, ketones, esters, glycol ethers, and glycol ether esters.

(4) The semiconductor nanoparticle complex dispersion liquid as described in (1) or (2) hereinabove, wherein
the organic dispersion medium is one dispersion medium or two or more mixed dispersion media selected from acetone, PGMEA, PGME, IPA, ethanol, and methanol.

(5) The semiconductor nanoparticle complex dispersion liquid as described in (1) or (2) hereinabove, wherein
the organic dispersion medium is one dispersion medium or two or more mixed dispersion media selected from the group consisting of glycol ethers and glycol ether esters.

(6) The semiconductor nanoparticle complex dispersion liquid as described in (1) or (2) hereinabove, wherein
the organic dispersion medium is one dispersion medium or two or more mixed dispersion media selected from the group consisting of PGMEA and PGME.

(7) The semiconductor nanoparticle complex dispersion liquid as described in any one of (1) to (6) hereinabove, wherein
a fluorescence quantum yield of the semiconductor nanoparticle complex dispersion liquid is 80% or more.

(8) The semiconductor nanoparticle complex dispersion liquid as described in any one of (1) to (7) hereinabove, wherein
the mass ratio of the aliphatic thiol ligand to the polar ligand (aliphatic thiol ligand/polar ligand) is 0.05 to 1.00.

(9) The semiconductor nanoparticle complex dispersion liquid as described in any one of (1) to (8) hereinabove, wherein
the aliphatic thiol ligand has 6 to 14 carbon atoms.

(10) The semiconductor nanoparticle complex dispersion liquid as described in any one of (1) to (9) hereinabove, wherein
the aliphatic thiol ligand is one or more of hexanethiol, octanethiol, and dodecanethiol.

(11) The semiconductor nanoparticle complex dispersion liquid as described in any one of (1) to (10) hereinabove, wherein
the molecular weight of the polar ligand is 600 or less.

(12) The semiconductor nanoparticle complex dispersion liquid as described in any one of (1) to (11) hereinabove, wherein
the molecular weight of the polar ligand is 450 or less.

(13) The semiconductor nanoparticle complex dispersion liquid as described in any one of (1) to (12) hereinabove, wherein
the organic group of the polar ligand has at least one of a hydroxyl group, a carboxyl group, a carbonyl group, an amino group, an ether bond, an ester bond, and a siloxane bond.

(14) The semiconductor nanoparticle complex dispersion liquid as described in any one of (1) to (13) hereinabove, wherein
the organic group of the polar ligand has an ether bond.

(15) The semiconductor nanoparticle complex dispersion liquid as described in any one of (1) to (14) hereinabove, wherein
the coordinating group of the polar ligand is a mercapto group or a carboxyl group.

(16) The semiconductor nanoparticle complex dispersion liquid as described in any one of (1) to (15) hereinabove, wherein
the coordinating group of the polar ligand is a mercapto group.

(17) The semiconductor nanoparticle complex dispersion liquid as described in any one of (1) to (16) hereinabove, wherein
the total mass fraction of the aliphatic thiol ligand and the polar ligand in all of the surface ligands is 0.7 or more.

(18) The semiconductor nanoparticle complex dispersion liquid as described in any one of (1) to (17) hereinabove, wherein
the total mass fraction of the aliphatic thiol ligand and the polar ligand in all of the surface ligands is 0.8 or more.

(19) The semiconductor nanoparticle complex dispersion liquid as described in any one of (1) to (18) hereinabove, wherein
Zn is contained in a surface composition of the semiconductor nanoparticle.

(20) The semiconductor nanoparticle complex dispersion liquid as described in any one of (1) to (19) hereinabove, wherein
a fluorescence quantum yield of the semiconductor nanoparticle complex is 80% or more.

(21) The semiconductor nanoparticle complex dispersion liquid as described in any one of (1) to (20) hereinabove, wherein
a fluorescence quantum yield of the semiconductor nanoparticle complex is 85% or more.

(22) The semiconductor nanoparticle complex dispersion liquid as described in any one of (1) to (21) hereinabove, wherein
a full width at half maximum of emission spectrum of the semiconductor nanoparticle complex is 40 nm or less.

(23) The semiconductor nanoparticle complex dispersion liquid as described in any one of (1) to (22) hereinabove, wherein
a full width at half maximum of emission spectrum of the semiconductor nanoparticle complex is 35 nm or less.
(24) The semiconductor nanoparticle complex dispersion liquid as described in any one of (1) to (23) hereinabove, wherein
the semiconductor nanoparticle includes In and P.
(25) The semiconductor nanoparticle complex dispersion liquid as described in any one of (1) to (24) hereinabove, wherein
the mass fraction of the semiconductor nanoparticles with respect to the semiconductor nanoparticle complex dispersion liquid is 20% by mass or more.
(26) The semiconductor nanoparticle complex dispersion liquid as described in any one of (1) to (25) hereinabove, wherein
the mass fraction of the semiconductor nanoparticles with respect to the semiconductor nanoparticle complex dispersion liquid is 25% by mass or more.
(27) The semiconductor nanoparticle complex dispersion liquid as described in any one of (1) to (26) hereinabove, wherein
the organic dispersion medium is a monomer or a prepolymer.

Further, the semiconductor nanoparticle complex composition and the semiconductor nanoparticle complex cured membrane of the present invention can be produced by the following production methods.

(28) A method for producing a semiconductor nanoparticle complex composition, comprising adding either one or both of a crosslinking agent and a dispersion medium to the semiconductor nanoparticle complex dispersion liquid as described in any one of (1) to (27) hereinabove.
(29) A method for producing a semiconductor nanoparticle complex cured membrane, comprising curing a semiconductor nanoparticle complex composition obtained by the method for producing a semiconductor nanoparticle complex composition as described in (28) hereinabove.

A semiconductor nanoparticle complex of the present invention has the following configuration.

<1> A semiconductor nanoparticle complex in which two or more ligands including an aliphatic thiol ligand and a polar ligand are coordinated to the surface of a semiconductor nanoparticle, wherein
the ligand is composed of an organic group and a coordinating group;
in the aliphatic thiol ligand, the organic group is an aliphatic hydrocarbon group, and the coordinating group is a mercapto group;
the polar ligand includes a hydrophilic functional group in the organic group; and
the mass ratio of the aliphatic thiol ligand to the polar ligand (aliphatic thiol ligand/polar ligand) is 0.05 to 1.00.
<2> The semiconductor nanoparticle complex as described in <1> hereinabove that can be dispersed in an organic dispersion medium having an SP value of 8.5 or more.
<3> The semiconductor nanoparticle complex as described in <1> or <2> hereinabove that can be dispersed in an organic dispersion medium having an SP value of 9.0 or more.
<4> The semiconductor nanoparticle complex as described in <2> or <3> hereinabove, wherein
the organic dispersion medium is one dispersion medium or two or more mixed dispersion media selected from the group consisting of alcohols, ketones, esters, glycol ethers, and glycol ether esters.
<5> The semiconductor nanoparticle complex as described in any one of <2> to <4> hereinabove, wherein
the organic dispersion medium is one dispersion medium or two or more mixed dispersion media selected from acetone, PGMEA, PGME, IPA, ethanol, and methanol.
<6> The semiconductor nanoparticle complex as described in any one of <1> to <5> hereinabove, wherein
the aliphatic thiol ligand has 6 to 14 carbon atoms.
<7> The semiconductor nanoparticle complex as described in any one of <1> to <6> hereinabove, wherein
the aliphatic thiol ligand is one or more of hexanethiol, octanethiol, decanethiol and dodecanethiol.
<8> The semiconductor nanoparticle complex as described in any one of <1> to <7> hereinabove, wherein
the molecular weight of the polar ligand is 600 or less.
<9> The semiconductor nanoparticle complex as described in any one of <1> to <8> hereinabove, wherein
the molecular weight of the polar ligand is 450 or less.
<10> The semiconductor nanoparticle complex as described in any one of <1> to <9> hereinabove, wherein
the total mass fraction of the aliphatic thiol ligand and the polar ligand in all of the ligands is 0.7 or more.
<11> The semiconductor nanoparticle complex as described in any one of <1> to <10> hereinabove, wherein
the total mass fraction of the aliphatic thiol ligand and the polar ligand in in all of the ligands is 0.8 or more.
<12> The semiconductor nanoparticle complex as described in any one of <1> to <11> hereinabove, wherein
the organic group of the polar ligand has at least one of a hydroxyl group, a carboxyl group, a carbonyl group, an amino group, an ether bond, an ester bond, and a siloxane bond.
<13> The semiconductor nanoparticle complex as described in any one of <1> to <12> hereinabove, wherein
the organic group of the polar ligand has an ether bond.
<14> The semiconductor nanoparticle complex as described in any one of <1> to <13> hereinabove, wherein
the coordinating group of the polar ligand is a mercapto group or a carboxyl group.
<15> The semiconductor nanoparticle complex as described in any one of <1> to <14> hereinabove, wherein
the coordinating group of the polar ligand is a mercapto group.
<16> The semiconductor nanoparticle complex as described in any one of <2> to <15> hereinabove, wherein
the semiconductor nanoparticle complex can be dispersed in the organic dispersion medium, and can be dispersed so that the mass fraction of the semiconductor nanoparticles is 20% by mass or more.
<17> The semiconductor nanoparticle complex as described in any one of <2> to <16> hereinabove, wherein
the semiconductor nanoparticle complex can be dispersed in the organic dispersion medium, and can be dispersed so that the mass fraction of the semiconductor nanoparticles is 25% by mass or more.
<18> The semiconductor nanoparticle complex as described in any one of <1> to <17> hereinabove, wherein
a fluorescence quantum yield of the semiconductor nanoparticle complex is 80% or more.
<19> The semiconductor nanoparticle complex as described in any one of <1> to <18> hereinabove, wherein a fluorescence quantum yield of the semiconductor nanoparticle complex is 85% or more.

<20> The semiconductor nanoparticle complex as described in any one of <1> to <19> hereinabove, wherein a full width at half maximum of emission spectrum of the semiconductor nanoparticle complex is 40 nm or less.

<21> The semiconductor nanoparticle complex as described in any one of <1> to <20> hereinabove, wherein a full width at half maximum of emission spectrum of the semiconductor nanoparticle complex is 35 nm or less.

<22> The semiconductor nanoparticle complex as described in any one of <1> to <21> hereinabove, wherein the semiconductor nanoparticle includes In and P.

<23> The semiconductor nanoparticle complex as described in any one of <1> to <22> hereinabove, wherein the semiconductor nanoparticle includes Zn on the surface of the semiconductor nanoparticle.

The semiconductor nanoparticle complex dispersion liquid of the present invention has the following configuration.

<24> A semiconductor nanoparticle complex dispersion liquid in which the semiconductor nanoparticle complex as described in any one of <1> to <23> hereinabove is dispersed in an organic dispersion medium.

The semiconductor nanoparticle complex composition of the present invention has the following configuration.

<25> A semiconductor nanoparticle complex composition in which the semiconductor nanoparticle complex as described in any one of <1> to <23> hereinabove is dispersed in a dispersion medium, wherein
the dispersion medium is a monomer or a prepolymer.

A semiconductor nanoparticle complex cured membrane of the present invention has the following configuration.

<26> A semiconductor nanoparticle complex cured membrane in which the semiconductor nanoparticle complex as described in any one of <1> to <23> hereinabove is dispersed in a polymer matrix.

The configurations and/or methods set forth in the present description are illustrated by way of example and can be changed in a variety of ways. Therefore, it can be understood that specific examples or embodiments thereof should not be considered to be limiting. The particular procedure or method set forth in the present description may represent one of a number of processing methods. Thus, various operations explained and/or described can be performed in the order explained and/or described, or can be omitted. Similarly, the order of the above methods can be changed.

The subject matter of the present disclosure is inclusive the various methods, systems and configurations disclosed in the present description, as well as any new and non-trivial combinations and secondary combinations of other features, functions, operations, and/or properties, as well as any equivalents thereof.

EXAMPLES

Hereinafter, the present invention will be specifically described with reference to Examples and Comparative Examples, but the present invention is not limited thereto.

Example 1

An InP-based semiconductor nanoparticle complex was prepared according to the following method.
(Core)
Indium acetate (0.3 mmol) and zinc oleate (0.6 mmol) were added to a mixture of oleic acid (0.9 mmol), 1-dodecanethiol (0.1 mmol) and octadecene (10 mL), followed by heating to about 120° C. and reacting for 1 h under vacuum (<20 Pa). The mixture reacted under vacuum was placed in a nitrogen atmosphere at 25° C., tris(trimethylsilyl) phosphine (0.2 mmol) was added thereto, and then the mixture was heated to about 300° C. and reacted for 10 min. The reaction liquid was cooled to 25° C., octanoic chloride (0.45 mmol) was injected thereinto, and the reaction liquid was heated at about 250° C. for 30 min and then cooled to 25° C. to obtain an InP-based semiconductor nanoparticle dispersion liquid.

Using such InP-based semiconductor nanoparticle as a core, a shell was formed on the surface of the core as described hereinbelow to produce core-shell type semiconductor nanoparticles, and optical characteristics thereof were measured.
(Shell Precursor)
In preparing the shell, the following precursors were first prepared.
<Preparation of Zn Precursor Solution>
A total of 40 mmol of zinc oleate and 75 mL of octadecene were mixed and heated in vacuum at 110° C. for 1 h to prepare a Zn precursor of [Zn]=0.4 M.
<Preparation of Se Precursor (Trioctylphosphine Selenide)>
A total of 22 mmol of selenium powder and 10 mL of trioctylphosphine were mixed in nitrogen and stirred until complete dissolution to obtain trioctylphosphine selenide of [Se]=2.2 M.
<Preparation of S Precursor (Trioctylphosphine Sulfide)>
A total of 22 mmol of sulfur powder and 10 mL of trioctylphosphine were mixed in nitrogen and stirred until complete dissolution to obtain trioctylphosphine sulfide of [S]=2.2 M.

Using each precursor obtained as described above, a shell was formed on the surface of the InP-based semiconductor nanoparticle (core) as follows.
(Shell)
The core dispersion liquid was heated to 200° C. At 200° C., 0.75 mL of the Zn precursor solution and trioctylphosphine selenide (Se precursor) were added at the same time and reacted for 30 min to form a ZnSe shell on the surface of InP-based semiconductor nanoparticle.

Further, 1.5 mL of the Zn precursor solution and 0.6 mmol of trioctylphosphine sulfide (S precursor) were added, the temperature was raised to 250° C., and the mixture was reacted for 1 h to form a ZnS shell.

The reaction solution of the semiconductor nanoparticles obtained by the synthesis was added to acetone, mixed well, and then centrifuged. The centrifugal acceleration was 4000 G. The precipitate was collected, and normal hexane was added to the precipitate to prepare a dispersion liquid. This operation was repeated several times to obtain purified semiconductor nanoparticles.
(Ligand)
—Preparation of Ligand Unit—
<Method for Preparing PEG-SH>
A total of 210 g of methoxy-PEG-OH (molecular weight 400) and 93 g of trimethylamine were placed in a flask and dissolved in 420 mL of THF (tetrahydrofuran). The solution was cooled to 0° C., and 51 g of methanesulfonic acid chloride was gradually added dropwise under a nitrogen atmosphere, while taking care that the temperature of the reaction solution did not exceed 5° C. due to the heat of reaction. Then, the reaction solution was heated to room temperature and stirred for 2 h. This solution was extracted with a chloroform-water system to collect the organic phase. The obtained solution was dried with magnesium sulfate, magnesium sulfate was removed by filtration, and the filtrate was concentrated by evaporation to obtain an oily intermediate. This was transferred to another flask, and 400 mL of 1.3 M aqueous thiourea solution was added under a nitrogen atmosphere. The solution was refluxed for 2 h, then 21 g of NaOH was added and the solution was refluxed for another 1.5 h. The reaction solution was cooled to room temperature, and a 1M HCl aqueous solution was added to reach pH=7 to neutralize the reaction solution. The obtained solution was extracted with a chloroform-water system to obtain the desired ligand (PEG-SH, molecular weight 400).

<Method for Preparing N-acetyl-N-(2-mercaptoethyl)propanamide>

A total of 1.2 g (10 mmol) of N-(2-sulfanylethyl)acetamide and 1.7 mL (12 mmol) of triethylamine were placed in a 100 mL round-bottom flask and dissolved in 30 mL of dehydrated dichloromethane. The solution was cooled to 0° C., and 0.87 mL (10 mmol) of propanoyl chloride was slowly added dropwise under a nitrogen atmosphere, while taking care that the temperature of the solution did not become equal to or higher than 5° C. After completion of the dropping, the reaction solution was heated to room temperature and stirred for 2 h. The reaction solution was filtered and the filtrate was diluted with chloroform. The solution was extracted in the order of 10% HCl aqueous solution, 10% $Na_2CO_3$ aqueous solution, and saturated NaCl aqueous solution, and the organic phase was collected. The organic phase was concentrated by evaporation and then purified by column chromatography using a hexane-ethyl acetate mixed solvent as a developing solvent to obtain the desired product.

<Method for Preparing PEG-COOH>

Methoxy-PEG-OH (molecular weight 350, 15 g) was dissolved in toluene (100 mL) at 60° C., 4.2 g of potassium tert-butoxide was added, and a reaction was conducted for 6 h. Then 5.5 g of ethyl bromoacetate was added to the mixture and the hydroxyl group in the PEG was protected by an ethyl acetate group. The mixture was filtered and the filtrate was precipitated in diethyl ether. The precipitate was dissolved in a 1M NaOH solution (40 mL), and NaCl (10 g) was added, followed by stirring at room temperature for 1 h to remove the ethyl group at the end of PEG. This solution was adjusted to pH 3.0 by adding 6M HCl. The obtained solution was extracted with a chloroform-water system to obtain PEG-COOH having a molecular weight of 400.

By changing methoxy-PEG-OH (molecular weight 350, 15 g) to methoxy-PEG-OH (molecular weight 550, 21 g) and performing the same preparation as above, PEG-COOH having a molecular weight of 600 was obtained.

By changing methoxy-PEG-OH (molecular weight 350, 15 g) to methoxy-PEG-OH (molecular weight 700, 26 g) and performing the same preparation as above, PEG-COOH having a molecular weight of 700 was obtained.

By changing methoxy-PEG-OH (molecular weight 350, 15 g) to methoxy-PEG-OH (molecular weight 950, 36 g) and performing the same preparation as above, PEG-COOH having a molecular weight of 1000 was obtained.

<Method for Preparing TBP-S>

A total of 3.2 g of sulfur was placed in a flask under a nitrogen atmosphere, 25 mL of tributylphosphine was added, and stirring was performed overnight to obtain TBP-S.

<Method for Preparing TOP-S>

A total of 3.2 g of sulfur was placed in a flask under a nitrogen atmosphere, 50 mL of trioctylphosphine was added, and stirring was performed overnight to obtain TOP-S.

(Preparation of Semiconductor Nanoparticle Complex)

A semiconductor nanoparticles-1-octadecene dispersion liquid was prepared in a flask by dispersing the purified semiconductor nanoparticles in 1-octadecene so as to obtain a mass ratio of the nanoparticles of 10% by mass. A total of 10.0 g of the prepared semiconductor nanoparticles-1-octadecene dispersion liquid was placed in a flask, 0.2 g of dodecanethiol (DDT) was added as an aliphatic thiol ligand, 4 g of PEG-SH was further added as a polar ligand, and stirring was performed at 110° C. for 60 min under a nitrogen atmosphere, followed by cooling to 25° C. to obtain a semiconductor nanoparticle complex. The reaction solution containing the semiconductor nanoparticle complex was transferred to a centrifuge tube and centrifuged at 4000 G for 20 min to separate into a transparent 1-octadecene phase and a semiconductor nanoparticle complex phase. The 1-octadecene phase was removed and the remaining semiconductor nanoparticle complex phase was collected.

A total of 5.0 mL of acetone was added to the obtained semiconductor nanoparticle complex phase to prepare a dispersion liquid. A total of 50 mL of normal hexane was added to the obtained dispersion liquid, followed by centrifugation at 4000 G for 20 min. After centrifugation, the clear supernatant was removed and the precipitate was collected. This operation was repeated several times to obtain a purified semiconductor nanoparticle complex.

(Measurement of Optical Characteristics of Semiconductor Nanoparticle Complex)

The optical characteristics of the semiconductor nanoparticle complex were measured using a fluorescence quantum yield measurement system (QE-2100, manufactured by Otsuka Electronics Co., Ltd.). The obtained semiconductor nanoparticle complex was dispersed in a dispersion medium, and a single light of 450 nm was used to obtain an emission spectrum. The fluorescence quantum yield (QY) and full width at half maximum (FWHM) were calculated from the emission spectrum after re-excitation correction in which a re-excitation fluorescence emission spectrum corresponding to fluorescence emission by reexcitation was excluded from the emission spectrum obtained herein. PGMEA was used as the dispersion medium.

(Dispersibility Test of Semiconductor Nanoparticle Complex)

The purified semiconductor nanoparticle complex was heated to 550° C. by differential thermogravimetric analysis (DTA-TG), held for 10 min, and cooled. The residual mass after the analysis was taken as the mass of the semiconductor nanoparticles, and the mass ratio of the semiconductor nanoparticles to the semiconductor nanoparticle complex was confirmed from this value.

With reference to the mass ratio, an organic dispersion medium was added to the semiconductor nanoparticle complex so that the mass fraction of the semiconductor nanoparticles was 20% by mass, and the dispersion state at that time was confirmed. As shown in Tables 1-1 to 1-7, the dispersion state was represented by yes when the nanoparticles were dispersed and by no when precipitation and turbidity were observed.

In Table 2, the dispersion state when PGMEA was used as the organic dispersion medium and the mass fraction of the semiconductor nanoparticles was set to 20% by mass to 35% by mass was represented by yes when the nanoparticles were dispersed and by no when precipitation and turbidity were observed.

When two types of organic dispersion media were used as the dispersion medium, a mixed dispersion medium obtained by mixing the dispersion media at a volume ratio of 1:1 was used.

For the purified semiconductor nanoparticle complex, the ligands coordinated to the semiconductor nanoparticle were measured using a nuclear magnetic resonance (NMR) device (JNM-LA400 manufactured by JEOL Ltd.). Deuterated chloroform was used as the solvent, and tetramethylsilane was used as the internal standard substance for the chemical shift in all measurements.

FIG. 1 shows the results of measuring the semiconductor nanoparticle complex produced in Example 1 by 1H-NMR. Signals were observed in the vicinity of 0.8 ppm to 2.5 ppm, and in the vicinity of 3.5 ppm to 4.0 ppm, and 5.4 ppm. FIG. 2 shows 1H-NMR spectra of dodecanethiol, oleic acid and PEG-SH.

From FIGS. 1 and 2, it was found that the signals in the vicinity of 0.8 ppm to 2.5 ppm and in the vicinity of 5.4 ppm were due to the alkyl group and the carbon-carbon double bond of the aliphatic thiol ligand, respectively, and it was found that the signal in the vicinity of 3.5 ppm to 4.0 ppm was due to the ether bond of the polar ligand. That is, by adding the signals of dodecanethiol, oleic acid and PEG-SH, all the signals obtained in the NMR spectrum of Example 1 can be explained consistently, and from this, it can be seen that the semiconductor nanoparticle complex of Example 1 contains dodecanethiol, oleic acid and PEG-SH as ligands.

Furthermore, from the comparison between FIGS. 1 and 2, it can be seen that the signals in the vicinity of 0.8 ppm to 2.5 ppm are attributed to dodecanethiol and oleic acid, the signal in the vicinity of 3.5 ppm to 4.0 ppm is attributed to PEG-SH, and the signal in the vicinity of 5.4 ppm is attributed to oleic acid, respectively. From the area ratios of these signals, the abundance ratios of the ligands were calculated as dodecanethiol: oleic acid: PEG-SH=8:3:89. In this way, the type and abundance ratio of the ligands can be determined from the position and peak area of each signal from the 1H-NMR spectrum.

Example 2

A semiconductor nanoparticle complex was prepared in the same manner as in Example 1, except that 0.5 g of dodecanethiol was used as the aliphatic thiol ligand and 4.0 g of PEG-SH was used as the polar ligand in the step of preparing the semiconductor nanoparticle complex.

Example 3

A semiconductor nanoparticle complex was prepared in the same manner as in Example 1, except that 1.0 g of dodecanethiol was used as the aliphatic thiol ligand, 1.5 g of PEG-SH was used as the polar ligand, and 0.5 g of oleic acid was further added in the step of preparing the semiconductor nanoparticle complex.

Example 4

A semiconductor nanoparticle complex was prepared in the same manner as in Example 1, except that 1.0 g of dodecanethiol was used as the aliphatic thiol ligand, 1.5 g of N-acetyl-N-(2-mercaptoethyl)propanamide was used as the polar ligand, and 0.5 g of oleic acid was further added in the step of preparing the semiconductor nanoparticle complex.

Example 5

A semiconductor nanoparticle complex was prepared in the same manner as in Example 1, except that 0.3 g of dodecanethiol and 0.2 g of hexanethiol were used as the aliphatic thiol ligand and 4.0 g of PEG-SH was used as the polar ligand in the step of preparing the semiconductor nanoparticle complex.

Example 6

A semiconductor nanoparticle complex was prepared in the same manner as in Example 1, except that 0.2 g of dodecanethiol was used as the aliphatic thiol ligand, 1.5 g of triethylene glycol monomethylthiol (TEG-SH) was used as the polar ligand, and 0.5 g of oleic acid was further added in the step of preparing the semiconductor nanoparticle complex.

Example 7

A semiconductor nanoparticle complex was prepared in the same manner as in Example 1, except that 0.5 g of octanethiol was used as the aliphatic thiol ligand and 4.0 g of N-acetyl-N-(2-mercaptoethyl)propanamide was used as the polar ligand in the step of preparing the semiconductor nanoparticle complex.

Example 8

A semiconductor nanoparticle complex was prepared in the same manner as in Example 1, except that 0.5 g of hexanethiol was used as the aliphatic thiol ligand and 4.0 g of N-acetyl-N-(2-mercaptoethyl)propanamide was used as the polar ligand in the step of preparing the semiconductor nanoparticle complex.

Example 9

A semiconductor nanoparticle complex was prepared in the same manner as in Example 1, except that 0.5 g of hexanethiol was used as the aliphatic thiol ligand and 4.0 g of PEG-SH was used as the polar ligand in the step of preparing the semiconductor nanoparticle complex.

Example 10

A semiconductor nanoparticle complex was prepared in the same manner as in Example 1, except that 1.0 g of decanethiol was used as the aliphatic thiol ligand and 4.0 g of N-acetyl-N-(2-mercaptoethyl)propanamide was used as the polar ligand in the step of preparing the semiconductor nanoparticle complex.

Example 11

A semiconductor nanoparticle complex was prepared in the same manner as in Example 1, except that 0.2 g of dodecanethiol was used as the aliphatic thiol ligand and 6.0 g of PEG-COOH (molecular weight 400) was used as the polar ligand in the step of preparing the semiconductor nanoparticle complex.

Example 12

A semiconductor nanoparticle complex was prepared in the same manner as in Example 1, except that 0.5 g of dodecanethiol was used as the aliphatic thiol ligand, 2.0 g of methyl 3-mercaptopropionate was used as the polar ligand and 0.5 g of oleic acid was further added in the step of preparing the semiconductor nanoparticle complex.

Example 13

A semiconductor nanoparticle complex was prepared in the same manner as in Example 1, except that 0.5 g of dodecanethiol was used as the aliphatic thiol ligand and 6.0 g of PEG-COOH (molecular weight 600) was used as the polar ligand in the step of preparing the semiconductor nanoparticle complex.

Example 14

A semiconductor nanoparticle complex was prepared in the same manner as in Example 1, except that 0.5 g of dodecanethiol was used as the aliphatic thiol ligand and 7.5 g of PEG-COOH (molecular weight 750) was used as the polar ligand in the step of preparing the semiconductor nanoparticle complex.

Example 15

A semiconductor nanoparticle complex was prepared in the same manner as in Example 1, except that 0.5 g of dodecanethiol was used as the aliphatic thiol ligand and 10.0 g of PEG-COOH (molecular weight 1000) was used as the polar ligand in the step of preparing the semiconductor nanoparticle complex.

Example 16

A semiconductor nanoparticle complex was prepared in the same manner as in Example 1, except that 0.5 g of dodecanethiol was used as the aliphatic thiol ligand, 4.0 g of PEG-SH was used as the polar ligand, and 1.5 g of oleic acid was further added in the step of preparing the semiconductor nanoparticle complex.

Comparative Example 1

A semiconductor nanoparticle complex was prepared in the same manner as in Example 1, except that 4.0 g of PEG-SH was used as the polar ligand and 4.0 g of tributylphosphine (TBP) was further added without adding an aliphatic thiol ligand in the step of preparing the semiconductor nanoparticle complex.

Comparative Example 2

A semiconductor nanoparticle complex was prepared in the same manner as in Example 1, except that 4.0 g of PEG-SH was used as the polar ligand and 4.0 g of trioctylphosphine (TOP) was further added without adding an aliphatic thiol ligand in the step of preparing the semiconductor nanoparticle complex.

Comparative Example 3

A total of 1.0 g of the semiconductor nanoparticle complex purified by the same method as in Example 1, 10 mL of isopropanol, and 4.0 g of PEG-SH were placed in a flask. The solution was stirred at 80° C. for 180 min under a nitrogen atmosphere and cooled to 25° C. A total of 50 mL of normal hexane was added to the reaction solution, followed by centrifugation at 4000 G for 20 min. After centrifugation, the clear supernatant was removed and the precipitate was collected. A total of 5.0 mL of acetone was added to the precipitate to prepare a dispersion liquid. A total of 50 mL of normal hexane was added to the obtained dispersion liquid followed by centrifugation at 4000 G for 20 min. After centrifugation, the clear supernatant was removed and the precipitate was collected. This operation was repeated several times to obtain a purified semiconductor nanoparticle complex.

Comparative Example 4

In the step of preparing the semiconductor nanoparticle complex, 2.0 g of dodecanethiol as an aliphatic thiol ligand and 1.0 g of N-acetyl-N-(2-mercaptoethyl)propanamide as a polar ligand were used, and 1.0 g of oleic acid was further added. Then, stirring was performed at 110° C. for 60 min under a nitrogen atmosphere followed by cooling to 25° C. A total of 5.0 mL of normal hexane was added to the reaction solution to prepare a dispersion liquid. A total of 50 mL of acetone was added to the obtained dispersion liquid, followed by centrifugation at 4000 G for 20 min. After centrifugation, the clear supernatant was removed and the precipitate was collected. This operation was repeated several times to obtain a purified semiconductor nanoparticle complex.

Since the semiconductor nanoparticle complex of Comparative Example 4 was not dispersed in PGMEA, the optical characteristics were measured after dispersing in normal hexane.

Comparative Example 5

A semiconductor nanoparticle complex was obtained in the same manner as in Example 1, except that 4.0 g of PEG-SH was further used as a polar ligand and 1.0 g of oleic acid was further added in the step of preparing the semiconductor nanoparticle complex without adding an aliphatic thiol in the step of preparing the semiconductor nanoparticle complex.

The emission characteristics, ligand mass ratio and dispersion state in the dispersion medium of the obtained semiconductor nanoparticle complexes are shown in Tables 1-1 to 1-7.

[The meanings of the abbreviations shown in Tables 1-1 to 1-7 are as follows.

QY: Fluorescence quantum yield

FWHM: Full width at half maximum of emission spectrum

QD: Semiconductor nanoparticles (quantum dots)

DDT: Dodecanethiol

Hex-SH: Hexanethiol

Oct-SH: Octanethiol

Dec-SH: Decanethiol

OA: Oleic acid

TABLE 1-1

| | Aliphatic thiol ligand | Polar ligand | | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- |
| | | Type | Molecular weight | Other ligand | Aliphatic thiol ligand | Polar ligand | Other ligand | | QY (%) | FWHM (nm) | Dispersion medium | SP value | |
| Example 1 | DDT | PEG—SH | 430 | OA | 5 | 92 | 3 | 0.05 | 88 | 36 | Hexane | 7.28 | no |
| | | | | | | | | | | | IBOA | 8.90 | yes |
| | | | | | | | | | | | Methyl acrylate | 9.37 | yes |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| | | | | | | | | | | | Methanol + Ethanol | 13.64 | yes |
| | | | | | | | | | | | PGMEA + Ethanol | 11.06 | yes |
| | | | | | | | | | | | PGMEA + Methanol | 11.64 | yes |
| Example 2 | DDT | PEG—SH | 430 | OA | 15 | 81 | 4 | 0.19 | 92 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 3 | DDT | PEG—SH | 430 | OA | 37 | 45 | 18 | 0.82 | 91 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | no |
| | | | | | | | | | | | Methanol | 14.38 | no |

TABLE 1-2

| | Aliphatic thiol ligand | Polar ligand | | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- |
| | | Type | Molecular weight | Other ligand | Aliphatic thiol ligand | Polar ligand | Other ligand | | QY (%) | FWHM (nm) | Dispersion medium | SP value | |
| Example 4 | DDT | N-acetyl-N-(2-mercaptoethyl)propanamide | 175 | OA | 35 | 47 | 18 | 0.74 | 91 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | no |
| | | | | | | | | | | | Methanol | 14.38 | no |
| Example 5 | DDT Hex—SH | PEG—SH | 430 | OA | 15 | 82 | 3 | 0.18 | 91 | 34 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 6 | DDT | TEG—SH (triethylene glycol monomethylthiol) | 180 | OA | 19 | 71 | 10 | 0.27 | 90 | 36 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | no |

TABLE 1-3

| | Aliphatic thiol ligand | Polar ligand | | Other ligand | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- | --- |
| | | Type | Molecular weight | | Aliphatic thiol ligand | Polar ligand | Other ligand | | QY (%) | FWHM (nm) | Dispersion medium | SP value | |
| Example 7 | Oct—SH | N-acetyl-N-(2-mercaptoethyl)propanamide | 175 | OA | 15 | 80 | 5 | 0.19 | 85 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 8 | Hex—SH | N-acetyl-N-(2-mercaptoethyl)propanamide | 175 | OA | 12 | 82 | 6 | 0.15 | 82 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 9 | Hex—SH | PEG—SH | 430 | OA | 10 | 84 | 6 | 0.12 | 82 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |

TABLE 1-4

| | Aliphatic thiol ligand | Polar ligand | | Other ligand | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- | --- |
| | | Type | Molecular weight | | Aliphatic thiol ligand | Polar ligand | Other ligand | | QY (%) | FWHM (nm) | Dispersion medium | SP value | |
| Example 10 | Dec—SH | N-acetyl-N-(2-mercaptoethyl)propanamide | 175 | OA | 18 | 78 | 4 | 0.23 | 91 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 11 | DDT | PEG—COOH | 400 | OA | 10 | 86 | 4 | 0.12 | 82 | 38 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Example 12 | DDT | Methyl 3-mercaptopropionate | 120 | OA | 21 | 66 | 13 | 0.32 | 89 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | no |
| | | | | | | | | | | | Methanol | 14.38 | no |

TABLE 1-5

| | Aliphatic thiol ligand | Polar ligand | | Other ligand | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- | --- |
| | | Type | Molecular weight | | Aliphatic thiol ligand | Polar ligand | Other ligand | | QY (%) | FWHM (nm) | Dispersion medium | SP value | |
| Example 13 | DDT | PEG—COOH | 600 | OA | 10 | 87 | 3 | 0.115 | 85 | 38 | Hexane | 7.28 | no |
| | | | | | | | | | | | PGMEA | 9.41 | yes |
| | | | | | | | | | | | PGME | 9.77 | yes |

TABLE 1-5-continued

| | Aliphatic thiol ligand | Polar ligand Type | Polar ligand Molecular weight | Other ligand | Mass ratio of ligands Aliphatic thiol ligand | Mass ratio of ligands Polar ligand | Mass ratio of ligands Other ligand | Aliphatic thiol ligand/ polar ligand | Optical characteristics of QD complex QY (%) | Optical characteristics of QD complex FWHM (nm) | Dispersivity Dispersion medium | Dispersivity SP value | Dispersivity Dispersion yes/no |
|---|---|---|---|---|---|---|---|---|---|---|---|---|---|
| Example 14 | DDT | PEG—COOH | 750 | OA | 8 | 89 | 3 | 0.09 | 86 | 38 | Acetone | 9.75 | yes |
| | | | | | | | | | | | Ethanol | 12.97 | yes |
| | | | | | | | | | | | Methanol | 14.38 | yes |
| | | | | | | | | | | | Hexane | 7.28 | no |
| | | | | | | | | | | | PGMEA | 9.41 | yes |
| | | | | | | | | | | | PGME | 9.77 | yes |
| Example 15 | DDT | PEG—COOH | 1000 | OA | 5 | 92 | 3 | 0.05 | 85 | 38 | Acetone | 9.75 | yes |
| | | | | | | | | | | | Ethanol | 12.97 | yes |
| | | | | | | | | | | | Methanol | 14.38 | yes |
| | | | | | | | | | | | Hexane | 7.28 | no |
| | | | | | | | | | | | PGMEA | 9.41 | yes |
| | | | | | | | | | | | PGME | 9.77 | yes |
| Example 16 | DDT | PEG—SH | 430 | OA | 8 | 60 | 32 | 0.13 | 75 | 39 | Acetone | 9.75 | yes |
| | | | | | | | | | | | Ethanol | 12.97 | yes |
| | | | | | | | | | | | Methanol | 14.38 | yes |
| | | | | | | | | | | | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | no |
| | | | | | | | | | | | Methanol | 14.38 | no |

TABLE 1-6

| | Aliphatic thiol ligand | Polar ligand Type | Polar ligand Molecular weight | Other ligand | Mass ratio of ligands Aliphatic thiol ligand | Mass ratio of ligands Polar ligand | Mass ratio of ligands Other ligand | Aliphatic thiol ligand/ polar ligand | Optical characteristics of QD complex QY (%) | Optical characteristics of QD complex FWHM (nm) | Dispersivity Dispersion medium | Dispersivity SP value | Dispersivity Dispersion yes/no |
|---|---|---|---|---|---|---|---|---|---|---|---|---|---|
| Comparative Example 1 | None | PEG—SH | 430 | TBP, OA | 0 | 80 | 20 | 0.00 | 72 | 42 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Comparative Example 2 | None | PEG—SH | 430 | TBP, OA | 0 | 75 | 25 | 0.00 | 62 | 45 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |
| Comparative Example 3 | DDT | PEG—SH | 430 | OA | 2 | 97 | 1 | 0.02 | 74 | 37 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |

TABLE 1-7

| | Aliphatic thiol ligand | Polar ligand | | Other ligand | Mass ratio of ligands | | | Aliphatic thiol ligand/ polar ligand | Optical characteristics of QD complex | | Dispersivity | | Dispersion yes/no |
| --- | --- | --- | --- | --- | --- | --- | --- | --- | --- | --- | --- | --- | --- |
| | | Type | Molecular weight | | Aliphatic thiol ligand | Polar ligand | Other ligand | | QY (%) | FWHM (nm) | Dispersion medium | SP value | |
| Comparative Example 4 | DDT | N-acetyl-N-(2-mercapto-ethyl)propan-amide | 175 | OA | 55 | 25 | 20 | 2.20 | 85 | 38 | Hexane | 7.28 | yes |
| | | | | | | | | | | | PGMEA | 9.41 | no |
| | | | | | | | | | | | PGME | 9.77 | no |
| | | | | | | | | | | | Acetone | 9.75 | no |
| | | | | | | | | | | | Ethanol | 12.97 | no |
| | | | | | | | | | | | Methanol | 14.38 | no |
| Comparative Example 5 | None | PEG—SH | 430 | OA | 0 | 80 | 20 | 0.00 | 72 | 38 | Hexane | 7.28 | no |
| | | | | | | | | | | | PGMEA | 9.41 | yes |
| | | | | | | | | | | | PGME | 9.77 | yes |
| | | | | | | | | | | | Acetone | 9.75 | yes |
| | | | | | | | | | | | Ethanol | 12.97 | yes |
| | | | | | | | | | | | Methanol | 14.38 | yes |

TABLE 2

Dispersibility test in PGMEA
Semiconductor nanoparticle mass ratio

| | | |
| --- | --- | --- |
| Example 1 | 20% by mass | yes |
| | 25% by mass | yes |
| | 30% by mass | yes |
| | 35% by mass | yes |
| Example 2 | 20% by mass | yes |
| | 25% by mass | yes |
| | 30% by mass | yes |
| | 35% by mass | yes |
| Example 3 | 20% by mass | yes |
| | 25% by mass | yes |
| | 30% by mass | yes |
| | 35% by mass | yes |
| Example 4 | 20% by mass | yes |
| | 25% by mass | yes |
| | 30% by mass | yes |
| | 35% by mass | yes |
| Example 5 | 20% by mass | yes |
| | 25% by mass | yes |
| | 30% by mass | yes |
| | 35% by mass | yes |
| Example 6 | 20% by mass | yes |
| | 25% by mass | yes |
| | 30% by mass | yes |
| | 35% by mass | yes |
| Example 7 | 20% by mass | yes |
| | 25% by mass | yes |
| | 30% by mass | yes |
| | 35% by mass | yes |
| Example 8 | 20% by mass | yes |
| | 25% by mass | yes |
| | 30% by mass | yes |
| | 35% by mass | yes |
| Example 9 | 20% by mass | yes |
| | 25% by mass | yes |
| | 30% by mass | yes |
| | 35% by mass | yes |
| Example 10 | 20% by mass | yes |
| | 25% by mass | yes |
| | 30% by mass | yes |
| | 35% by mass | yes |
| Example 11 | 20% by mass | yes |
| | 25% by mass | yes |
| | 30% by mass | yes |
| | 35% by mass | yes |
| Example 12 | 20% by mass | yes |
| | 25% by mass | yes |
| | 30% by mass | yes |
| | 35% by mass | yes |
| Example 13 | 20% by mass | yes |
| | 25% by mass | yes |
| | 30% by mass | no |
| | 35% by mass | no |
| Example 14 | 20% by mass | yes |
| | 25% by mass | no |
| | 30% by mass | no |
| | 35% by mass | no |
| Example 15 | 20% by mass | yes |
| | 25% by mass | no |
| | 30% by mass | no |
| | 35% by mass | no |
| Example 16 | 20% by mass | yes |
| | 25% by mass | yes |
| | 30% by mass | yes |
| | 35% by mass | yes |
| Comparative example 1 | 20% by mass | yes |
| | 25% by mass | yes |
| | 30% by mass | yes |
| | 35% by mass | yes |
| Comparative example 2 | 20% by mass | yes |
| | 25% by mass | yes |
| | 30% by mass | yes |
| | 35% by mass | yes |
| Comparative example 3 | 20% by mass | yes |
| | 25% by mass | yes |
| | 30% by mass | yes |
| | 35% by mass | yes |
| Comparative example 4 | 20% by mass | no |
| | 25% by mass | no |
| | 30% by mass | no |
| | 35% by mass | no |
| Comparative example 5 | 20% by mass | yes |
| | 25% by mass | yes |
| | 30% by mass | yes |
| | 35% by mass | yes |

The invention claimed is:

1. A semiconductor nanoparticle complex dispersion liquid in which a semiconductor nanoparticle complex is dispersed in an organic dispersion medium, wherein
the semiconductor nanoparticle complex is composed of two or more ligands including an aliphatic thiol ligand and a polar ligand, and a semiconductor nanoparticle with the ligands coordinated to a surface thereof;
each ligand is composed of an organic group and a coordinating group;

in the aliphatic thiol ligand, the organic group is an aliphatic hydrocarbon group, and the coordinating group is a mercapto group;

the organic group of the polar ligand includes a hydrophilic functional group;

the coordinating group of the polar ligand is a mercapto group;

a mass ratio of the aliphatic thiol ligand to the polar ligand (aliphatic thiol ligand/polar ligand) is 0.05 to 1.00; and an SP value of the organic dispersion medium is 8.5 or more.

2. The semiconductor nanoparticle complex dispersion liquid according to claim 1, wherein
the SP value of the organic dispersion medium is 9.0 or more.

3. The semiconductor nanoparticle complex dispersion liquid according to claim 1, wherein
the organic dispersion medium is one dispersion medium or two or more mixed dispersion media selected from the group consisting of alcohols, ketones, esters, glycol ethers, and glycol ether esters.

4. The semiconductor nanoparticle complex dispersion liquid according to claim 1, wherein
the organic dispersion medium is one dispersion medium or two or more mixed dispersion media selected from the group consisting of PGMEA and PGME.

5. The semiconductor nanoparticle complex dispersion liquid according to claim 1, wherein
a fluorescence quantum yield of the semiconductor nanoparticle complex dispersion liquid is 80% or more.

6. The semiconductor nanoparticle complex dispersion liquid according to claim 1, wherein
a mass fraction of semiconductor nanoparticles in the semiconductor nanoparticle complex dispersion liquid with respect to the semiconductor nanoparticle complex dispersion liquid is 20% by mass or more.

7. The semiconductor nanoparticle complex dispersion liquid according to claim 1, wherein
the organic dispersion medium is a monomer or a prepolymer.

8. A semiconductor nanoparticle complex in which two or more ligands including an aliphatic thiol ligand and a polar ligand are coordinated to a surface of a semiconductor nanoparticle, wherein
each ligand is composed of an organic group and a coordinating group;
in the aliphatic thiol ligand, the organic group is an aliphatic hydrocarbon group, and the coordinating group is a mercapto group;
the polar ligand includes a hydrophilic functional group in the organic group;
the coordinating group of the polar ligand is a mercapto group; and
a mass ratio of the aliphatic thiol ligand to the polar ligand (aliphatic thiol ligand/polar ligand) is 0.05 to 1.00.

9. The semiconductor nanoparticle complex according to claim 8, wherein
the aliphatic thiol ligand has 6 to 14 carbon atoms.

10. The semiconductor nanoparticle complex according to claim 8, wherein
a molecular weight of the polar ligand is 600 or less.

11. The semiconductor nanoparticle complex according to claim 8, wherein
a total mass fraction of the aliphatic thiol ligand and the polar ligand in all of the ligands is 0.7 or more.

12. The semiconductor nanoparticle complex according to claim 8, wherein
the organic group of the polar ligand has at least one of a hydroxyl group, a carboxyl group, a carbonyl group, an amino group, an ether bond, an ester bond, and a siloxane bond.

13. The semiconductor nanoparticle complex according to claim 8, wherein
the organic group of the polar ligand has an ether bond.

14. The semiconductor nanoparticle complex according to claim 8, wherein
a fluorescence quantum yield of the semiconductor nanoparticle complex is 80% or more.

15. The semiconductor nanoparticle complex according to claim 8, wherein
a full width at half maximum of emission spectrum of the semiconductor nanoparticle complex is 40 nm or less.

16. The semiconductor nanoparticle complex according to claim 8, wherein
the semiconductor nanoparticle includes In and P.

17. A semiconductor nanoparticle complex dispersion liquid in which the semiconductor nanoparticle complex according to claim 8 is dispersed in an organic dispersion medium.

18. A semiconductor nanoparticle complex composition in which the semiconductor nanoparticle complex according to claim 8 is dispersed in a dispersion medium, wherein
the dispersion medium is a monomer or a prepolymer.

19. A semiconductor nanoparticle complex cured membrane in which the semiconductor nanoparticle complex according to claim 8 is dispersed in a polymer matrix.

* * * * *